United States Patent
Gieske et al.

(10) Patent No.: US 12,119,043 B2
(45) Date of Patent: Oct. 15, 2024

(54) PRACTICAL AND EFFICIENT ROW HAMMER ERROR DETECTION

(71) Applicant: Micron Technology, Inc., Boise, ID (US)

(72) Inventors: Edmund Gieske, Boise, ID (US); Sujeet Ayyapureddi, Boise, ID (US); Yang Lu, Boise, ID (US); Amitava Majumdar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 17/898,737

(22) Filed: Aug. 30, 2022

(65) Prior Publication Data

US 2023/0260565 A1    Aug. 17, 2023

Related U.S. Application Data

(60) Provisional application No. 63/303,910, filed on Jan. 27, 2022.

(51) Int. Cl.
*G11C 11/4078*    (2006.01)
*G11C 11/406*    (2006.01)

(52) U.S. Cl.
CPC .... *G11C 11/4078* (2013.01); *G11C 11/40615* (2013.01); *G11C 11/40618* (2013.01)

(58) Field of Classification Search
CPC .......... G11C 11/4078; G11C 11/40615; G11C 11/40618
See application file for complete search history.

(56) References Cited

U.S. PATENT DOCUMENTS

| | | | |
|---|---|---|---|
| 11,651,834 B2* | 5/2023 | Lu | G11C 29/12015 365/185.09 |
| 2023/0015086 A1* | 1/2023 | Ayyapureddi | G11C 29/42 |
| 2023/0206988 A1* | 6/2023 | Ayyapureddi | G11C 11/408 365/185.04 |

\* cited by examiner

*Primary Examiner* — Connie C Yoha
(74) *Attorney, Agent, or Firm* — Wood IP LLC; Theodore A. Wood

(57) ABSTRACT

Practical, energy-efficient, and area-efficient, mitigation of errors in a memory media device that are caused by row hammer attacks and the like is described. The detection of errors is deterministically performed while maintaining, in an SRAM, a number of row access counters that is smaller than the total number of rows protected in the memory media device. The mitigation may be implemented on a per-bank basis. The memory media device may be DRAM.

20 Claims, 12 Drawing Sheets

602 Row Access Req.

Row Sequence 604

606

|  | | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
|  | Row Accessed | 9 | 7 | 6 | 7 | 10 | 11 | 12 | 7 | 7 | 9 | 6 | 6 | 9 | 9 | 6 | 6 |
| Cntr 1 | Addr | 9 | 9 | 9 | 9 | 9 | 9 | 12 | 12 | 12 | 12 | 12 | 12 | 12 | 12 | 12 | 12 |
| | Count | 1 | 1 | 1 | 1 | 1 | 1 | 2 | 2 | 2 | 2 | 2 | 2 | 2 | 2 | 2 | 2 |
| Cntr 2 | Addr |  | 7 | 7 | 7 | 7 | 7 | 7 | 7 | 7 | 7 | 7 | 7 | 7 | 7 | 7 | 7 |
| | Count |  | 1 | 1 | 2 | 2 | 2 | 2 | 3 | 4 | 4 | 4 | 4 | 4 | 4 | 4 | 4 |
| Cntr 3 | Addr |  |  | 6 | 6 | 6 | 11 | 11 | 11 | 11 | 11 | 11 | 11 | 9 | 9 | 9 | 9 |
| | Count |  |  | 1 | 1 | 1 | 2 | 2 | 2 | 2 | 2 | 2 | 2 | 3 | 4 | 4 | 4 |
| Cntr 4 | Addr |  |  |  |  | 10 | 10 | 10 | 10 | 10 | 9 | 6 | 6 | 6 | 6 | 6 | 6 |
| | Count |  |  |  |  | 1 | 1 | 1 | 1 | 1 | 2 | 3 | 4 | 4 | 4 | 5 | 6 |
| | Total |  |  |  |  |  |  |  |  |  |  |  |  |  |  |  | 16 |

PRACTICAL AND EFFICIENT ROW HAMMER ERROR DETECTION

CROSS REFERENCE TO RELATED APPLICATIONS

This application claims priority from U.S. Provisional Application No. 63/303,910, filed Jan. 27, 2022, the contents of which are hereby incorporated by reference. Additionally, this application is related to the following commonly assigned U.S. patent application Ser. No. 17/941,551, filed Sep. 9, 2022, entitled "Cache Policy Biased by High DRAM Row Activation Rate:" U.S. patent application Ser. No. 17/941,558, filed Sep. 9, 2022, entitled "Memory Media Row Activation-Biased Caching:" U.S. patent application Ser. No. 17/940,785, filed Sep. 8, 2022, entitled "RHR Interrupts to the Operating System:" and U.S. patent application Ser. No. 17/897,813, filed Aug. 29, 2022, entitled "Area Optimized RHR Solution for the CXL Controller:" and U.S. patent application Ser. No. 17/941,655, filed Sep. 9, 2022, entitled "Aliased Row Hammer Detector," the contents of each of which is hereby incorporated by reference.

FIELD OF TECHNOLOGY

The present disclosure relates to deterministic detection of row hammer errors in memory media.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory may maintain their programmed states for the duration of the system being powered on. Non-volatile memory cells (e.g., NAND memory cells) may maintain their programmed states for extended periods of time even in the absence of an external power source.

Memory devices may be coupled to a host (e.g., a host computing device) to store data, commands, and/or instructions for use by the host while the computer or other electronic system is operating. For example, data, commands, and/or instructions can be transferred between the host and the memory device(s) during operation of a computing or other electronic system. A controller, referred to as a "memory controller", may be used to manage the transfer of data, commands, and/or instructions between the host and the memory devices.

DRAM is organized as an array of storage cells with each cell storing a programmed value. As noted above, the cells can lose their programmed values if not periodically refreshed. Thus, the rows are refreshed at a fixed interval often referred to as the "refresh interval". The refresh is also called a "row activation". In a row activation, a row in the DRAM device is read, error corrected and written back to that same physical row: Data corruption caused by "row hammer events" (also referred to as "row hammer attacks") are a significant risk in recent DRAM devices.

A row hammer event occurs when a particular row in a media device is accessed too many times, that is, more than a "row hammer threshold" (RHT) number of times, in an "activation interval" (i.e., the interval between two refresh/activation events). Specifically, when a particular row (an "aggressor row") is accessed more than a RHT number of times during an activation interval, one or more rows ("victim rows") that are physically proximate to that particular row in the DRAM media can be affected as a result of the frequent activation of the particular row, and data corruption of the one or more rows may occur. Due to various physical effects of shrinking manufacturing process geometries, the RHT of memory devices has decreased to a level at which even normal computer system programs can inadvertently corrupt their own data or the data of another program sharing the same system's memory. Conventional row hammer detection techniques are either practical but imperfect allowing data corruption or severe performance degradation, or perfect but impractically costly in required resources.

Conventional row hammer detector algorithms, such as "Address Sampling" and "Priority CAM" (priority content addressable memory) are probabilistic and thus cannot guarantee perfect (i.e., complete, accurate, and precise) prevention of data corruption in all row hammer scenarios. If an aggressor (e.g., a malicious attacker) knows sufficient details of these conventional row hammer detection methods and their implementation, the aggressor can attack their weaknesses to bypass or break them and corrupt data.

The "direct" or "perfect" row tracking method, in which a counter is maintained for each row in the DRAM media, is a known perfect row hammer detection algorithm, but its implementation requires both amounts of memory and operating power that are too high to be practically useful.

Guaranteed row hammer event elimination is compelling for any memory device, but is especially compelling for systems such as, for example, hyperscale datacenters (HSDC). In HSDCs, typically multiple customers share processors and memory. A malicious attacker can use row hammer attacks to silently (e.g., without detection) corrupt other customers' data to possibly escalate its privilege to take control of more system resource or compromise data center security.

Currently row hammer corruption is indistinguishable from other soft errors. Modern workloads thrash processor caches and cause unintentional row hammer scenarios. Detected errors beyond a threshold rate require physical service of the dual in-line memory modules (DIMMs) which are often returned to the supplier for credit.

Therefore, improved techniques for mitigating soft errors such as row hammer errors are desired.

BRIEF DESCRIPTION OF THE DRAWINGS

FIG. 6 is an illustration of the maintenance of a limited number of counters in accordance with the space saving algorithm.

DETAILED DESCRIPTION

This disclosure describes systems, apparatuses, and methods related to a detector for memory media soft errors, such as, for example, row hammer errors. The detector, sometimes referred to herein as a row hammer detector, is configured to perform deterministic detection of row hammer attacks in DRAM media in a practical (e.g., space efficient and energy efficient) manner. The detector is based on a modified "space saving" algorithm.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

In some embodiments, the row hammer detector is located in a "memory controller". The memory controller can orchestrate performance of operations to write data to at least one of multiple types of memory devices.

Figure 1:
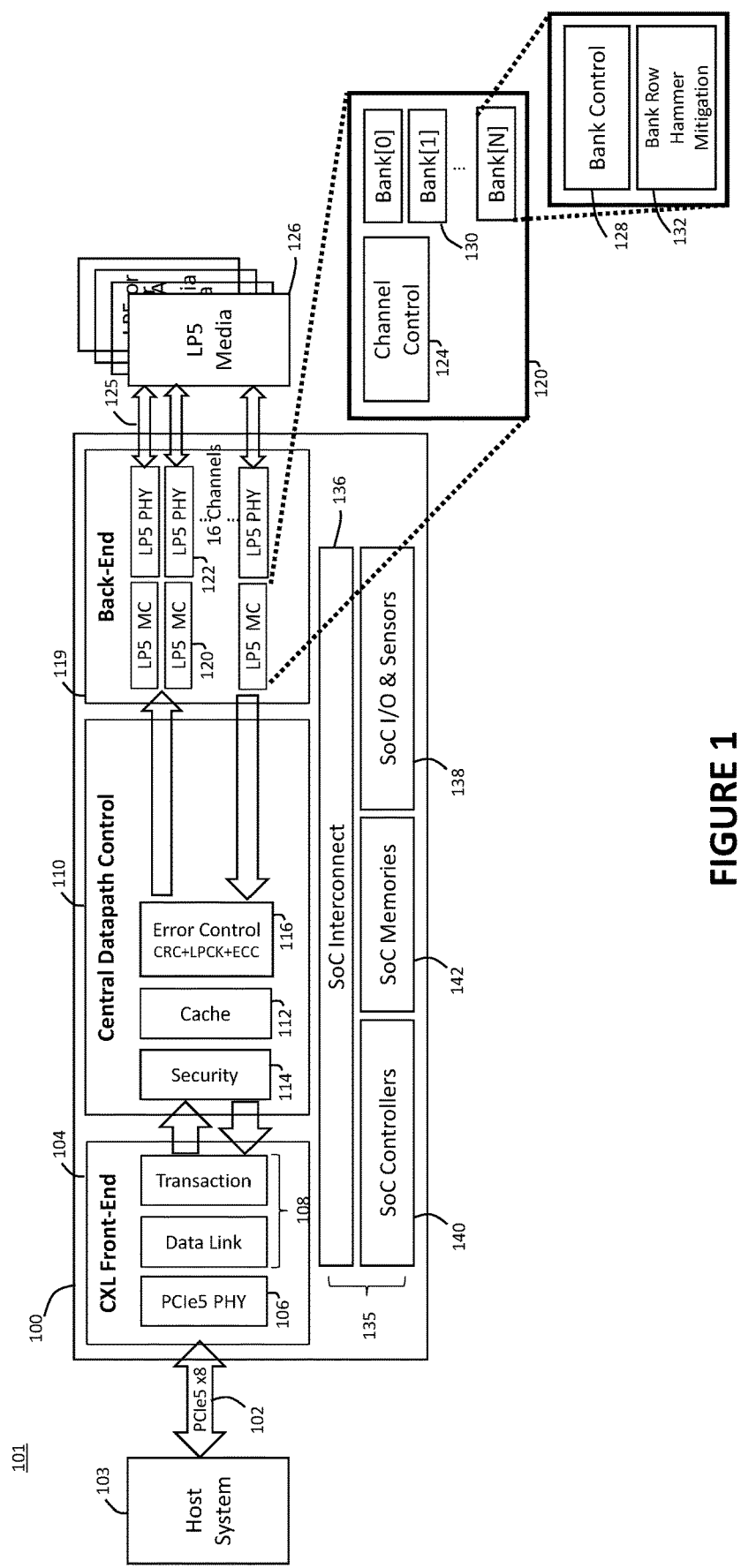
FIG. 1 illustrates an example functional block diagram in the form of a computing system including a memory controller configured for detecting row hammer attacks in accordance with some example embodiments of the present disclosure.

FIG. 1 illustrates an example functional block diagram in the form of a computing system 101 including a memory controller 100 configured for detecting row hammer attacks in accordance with some embodiments of the present disclosure. The computing system 101 can detect and mitigate row hammer attacks on one or more memory devices 126. The memory controller 100 comprises a front-end portion 104, a central controller portion 110, a back-end portion 119, and a management unit 135. The memory controller 100 can be coupled to a host 103 (i.e., host system 103) and memory device 126. In some embodiments, memory device 126 may be a DRAM device.

The front-end portion 104 includes an interface 106 to couple the memory controller 100 to the host 103 through one or more input/output (I/O) lanes 102. The communications over I/O lanes 102 may be according to a protocol such as, for example, Peripheral Component Interconnect Express (PCIe). In some embodiments, the plurality of I/O lanes 102 can be configured as a single port. Example embodiments are not limited by the number of I/O lanes, whether or not the I/O lanes belong to a single port, or the communication protocol for communicating with the host. The interface 106 receives data and/or commands from host 103 through I/O lanes 102. In an embodiment, the interface 106 is a physical (PHY) interface configured for PCIe communications. The front-end portion 104 may include interface management circuitry 108 (including data link and transaction control) which may provide higher layer protocol support for communications with host 103 through PHY interface 106.

The central controller portion 110 is configured to control, in response to receiving a request or command from host 103, performance of a memory operation. The memory operation can be a memory operation to read data from, or write data to, memory device 126. The central controller portion 110 may comprise a cache memory 112 to store data associated with the performance of the memory operation, a security component 114 configured to encrypt the data before storing, and to decrypt data after reading, the data in memory device 126.

In some embodiments, in response to receiving a request from host 103, data from host 103 can be stored in cache lines of cache memory 112. The data in the cache memory can be written to memory device 126. An error correction component 116 is configured to provide error correction to data read from and/or written to memory device 126. In some embodiments, the data can be encrypted using an encryption protocol such as, for example, Advanced Encryption Standard (AES) encryption, before the data is stored in the cache memory. In some embodiments, the central controller portion 110 can, in response to receiving a request from host 103, control writing of multiple pages of data substantially simultaneously to memory device 126.

The management unit 135 is configured to control operations of the memory controller 100. The management unit may recognize commands from the host 103 and accordingly manage the one or more memory devices 126. In some embodiments, the management unit 135 includes an I/O bus 138 to manage out-of-band data, a management unit controller 140 to execute a firmware whose functionalities include, but not limited to, monitoring and configuring the characteristics of the memory controller 100, and a management unit memory 142 to store data associated with memory controller 100 functionalities. The management unit controller 140 may also execute instructions associated with initializing and configuring the characteristics of the memory controller 100. An endpoint of the management unit 135 can be exposed to the host system 103 to manage data through a communication channel using the I/O bus 138.

A second endpoint of the management unit 135 can be exposed to the host system 103 to manage data through a communication channel using interface 106. In some embodiments, the characteristics monitored by the management unit 135 can include a voltage supplied to the memory controller 100 or a temperature measured by an external sensor, or both. Further, the management unit 135 can include a local bus interconnect 136 to couple different components of the memory controller 100. In some embodiments, the local bus interconnect 136 can include, but is not limited to, an advanced high-performance bus (AHB).

The management unit 135 can include a management unit controller 140. In some embodiments, the management unit controller 140 can be a controller that meets the Joint Test Action Group (JTAG) standard and operate according to an Inter-Integrate Circuit (I2C) protocol, and auxiliary I/O circuitry. As used herein, the term "JTAG" generally refers to an industry standard for verifying designs and testing printed circuitry boards after manufacture. As used herein, the term "I2C" generally refers to a serial protocol for a two-wire interface to connect low-speed devices like microcontrollers, I/O interfaces, and other similar peripherals in embedded systems.

The back-end portion 119 is configured to couple to one or more types of memory devices (e.g. DRAM media 126) via (e.g., through) a plurality of channels 125, which can be used to read/write data to/from the memory devices 126, to transmit commands to memory device 126, to receive status and statistics from memory device 126, etc. The management unit 135 can couple, by initializing and/or configuring the memory controller 100 and/or the memory device 126 accordingly, the memory controller 100 to external circuitry or an external device, such as host 103 that can generate requests to read or write data to and/or from the memory device(s). The management unit 135 is configured to recognize received commands from the host 103 and to execute instructions to apply a particular operation code associated with received host commands for each of a plurality of channels coupled to the memory device 126.

The back-end portion 119 includes a media controller portion comprising a plurality of media controllers 120 and a physical (PHY) layer portion comprising a plurality of PHY interfaces 122. In some embodiments, the back-end portion 119 is configured to couple the PHY interfaces 122 to a plurality of memory ranks of the memory device 126. Memory ranks can be connected to the memory controller 100 via a plurality of channels 125. A respective media controller 120 and a corresponding PHY interface 122 may drive a channel 125 to a memory rank. In some embodiments, each media controller 120 can execute commands independent of the other media controllers 120. Therefore, data can be transferred from one PHY interface 122 through a channel 125 to memory device 126 independent of other PHY interfaces 122 and channels 125.

Each PHY interface 122 may operate in accordance with a physical (PHY) layer that couples the memory controller 100 to one or more memory ranks in the memory device 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can be a plurality of channels 125. As used herein, the term "memory ranks" generally refers to a plurality of memory chips (e.g., DRAM memory chips) that can be accessed simultaneously. In some embodiments, a memory rank can be sixty-four (64) bits wide and each memory rank can have eight (8) pages. In some embodiments, a page size of a first type of memory device can be larger than a page size of the second type of memory device. Example embodiments, however, are not limited to particular widths of memory ranks or page sizes.

Each media controller 120 may include a channel control circuitry 124 and a plurality of bank control circuitry 128 where a respective one of the plurality of bank control circuitry 128 is configured to access a respective bank 130 of the plurality of banks on the media device 126 accessed by the respective media controller 120. As described in more detail below a memory error detector, or more particularly a respective per-bank row hammer mitigation circuitry 132, is configured for each bank 120 in each channel in embodiments of this disclosure.

Rank, channel, and bank can be considered hardware-dependent logical groupings of storage locations in the media device. The mapping of rank, channel and bank logical groupings to physical storage locations or rows in the memory device 126 may be preconfigured or may be configurable in some embodiments by the memory controller in communication with the memory device 126.

In some embodiments, the memory controller 100 can be a Compute Express Link™ (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost. CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. When the memory controller 100 is CXL compliant, the interface management circuitry 108 (including data link and transaction control 108) may use CXL protocols to manage the interface 106 which may comprise PCIe PHY interfaces.

According to some embodiments, the memory device 126 includes one or more DRAM devices. In some embodiments, main memory is stored in DRAM cells that have high storage density. DRAM cells lose their state over time. That is, the DRAM cells must be refreshed periodically, hence the name "Dynamic". DRAM can be described as being organized according to a hierarchy of storage organization comprising DIMM, rank, bank, and array. A DIMM comprises a plurality of DRAM chips, and the plurality of chips in a DIMM are organized into one or more "ranks". Each chip is formed of a plurality of "banks". A bank is formed of one or more "rows" of the array of memory cells. All banks within the rank share all address and control pins. All banks are independent, but in some embodiments only one bank in a rank can be accessed at a time. Because of electrical constraints, only a few DIMMs can be attached to a bus. Ranks help increase the capacity on a DIMM.

Multiple DRAM chips are used for every access to improve data transfer bandwidth. Multiple banks are provided so that the computing system can be simultaneously working on different requests. To maximize density, arrays within a bank are made large, rows are wide, and row buffers are wide (8 KB read for a 64B request). Each array provides a single bit to the output pin in a cycle (for high density and because there are few pins). DRAM chips are often described as xN, where N refers to the number of output pins: one rank may be composed of eight ×8 DRAM chips (e.g., the data bus is 64 bits). Banks and ranks offer memory parallelism, and the memory controller 100 may schedule memory accesses to maximize row buffer hit rates and bank/rank parallelism.

In the embodiment illustrated in FIG. 1, the memory device 126 is low power double data rate (LPDDR) LP5 or other similar memory interfaces. However, embodiments are not limited thereto, and memory device 126 may comprise one or more memory media of any memory media types, such as, but not limited to, types of DRAM, that are subject to row hammer attacks or similar memory attacks.

Each of the plurality of media controllers 120 can receive a same command and address and drive the plurality of channels 125 substantially simultaneously. By using the same command and address for the plurality of media controllers, each of the plurality of media controllers 120 can utilize the plurality of channels 125 to perform the same memory operation on the same plurality memory cells. Each media controller 120 can correspond to a RAID component. As used herein, the term "substantially" intends that the characteristic needs are not absolute but is close enough to achieve the advantages of the characteristic.

For example, "substantially simultaneously" is not limited to operations that are performed simultaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at the same time. For example, multiple memory controllers can be utilized such that they are writing data to the memory devices at the same time regardless if one of the media controllers commences or terminates prior to the other.

Figure 2A:
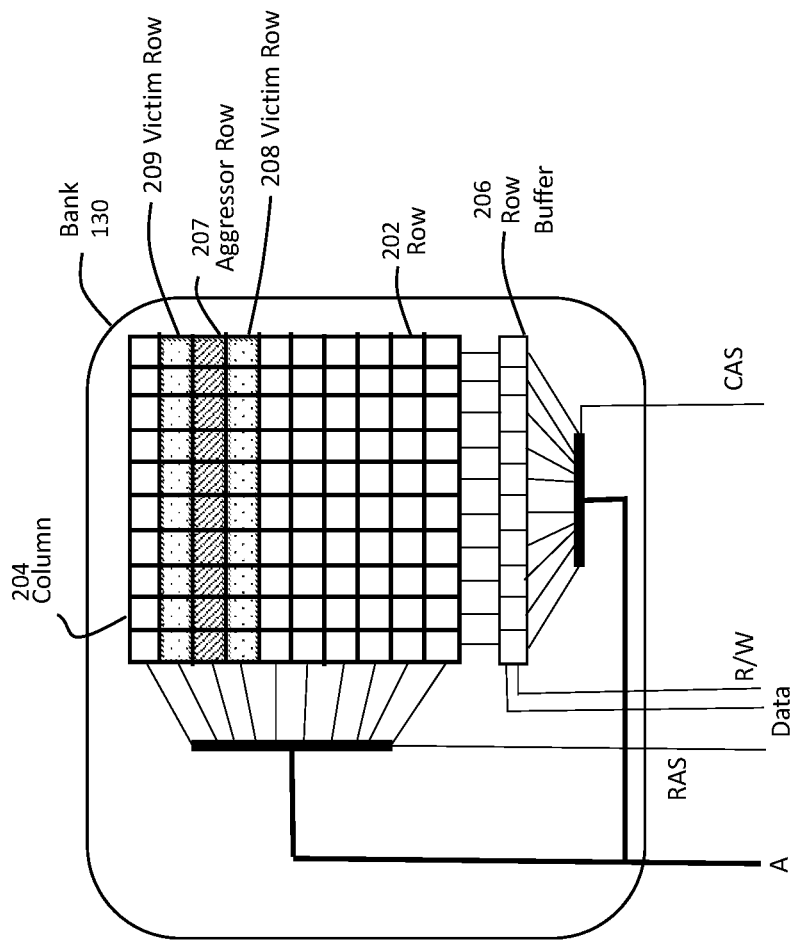
FIG. 2A illustrates a schematic view of a memory bank in a DRAM media device.

FIG. 2A illustrates a schematic view of a memory bank 130 viewed in a DRAM device such as memory device 126. The illustrated bank 130 represents an 10×10 array of cells organized in 10 rows (e.g., row 202) and 10 columns (e.g., column 204). The bank is stored to or read from, one row at a time, via a row buffer 206. Each cell in the array is accessed by providing a row address and a column address. The address bus, a row access strobe signal, a column access strobe signal (shown in FIG. 2A as A, RAS, CAS, respectively) are used to access particular memory locations in the array. The row buffer 206 and the data or read/write signals are used for the data to be read from or stored to memory locations.

In some memory devices, a counter, not shown in FIG. 2A, may be associated with a row to keep track of the number of times that row has been activated during a particular time interval. For example, the counter may be initialized at the beginning of each refresh interval and be incremented for each access to that row during that refresh interval. In conventional perfect tracking implementations, a respective counter was associated with each row. In example embodiments, the number of counters maintained is much smaller than the total number of rows in the memory device(s) attached to the memory controller.

Figure 2B:
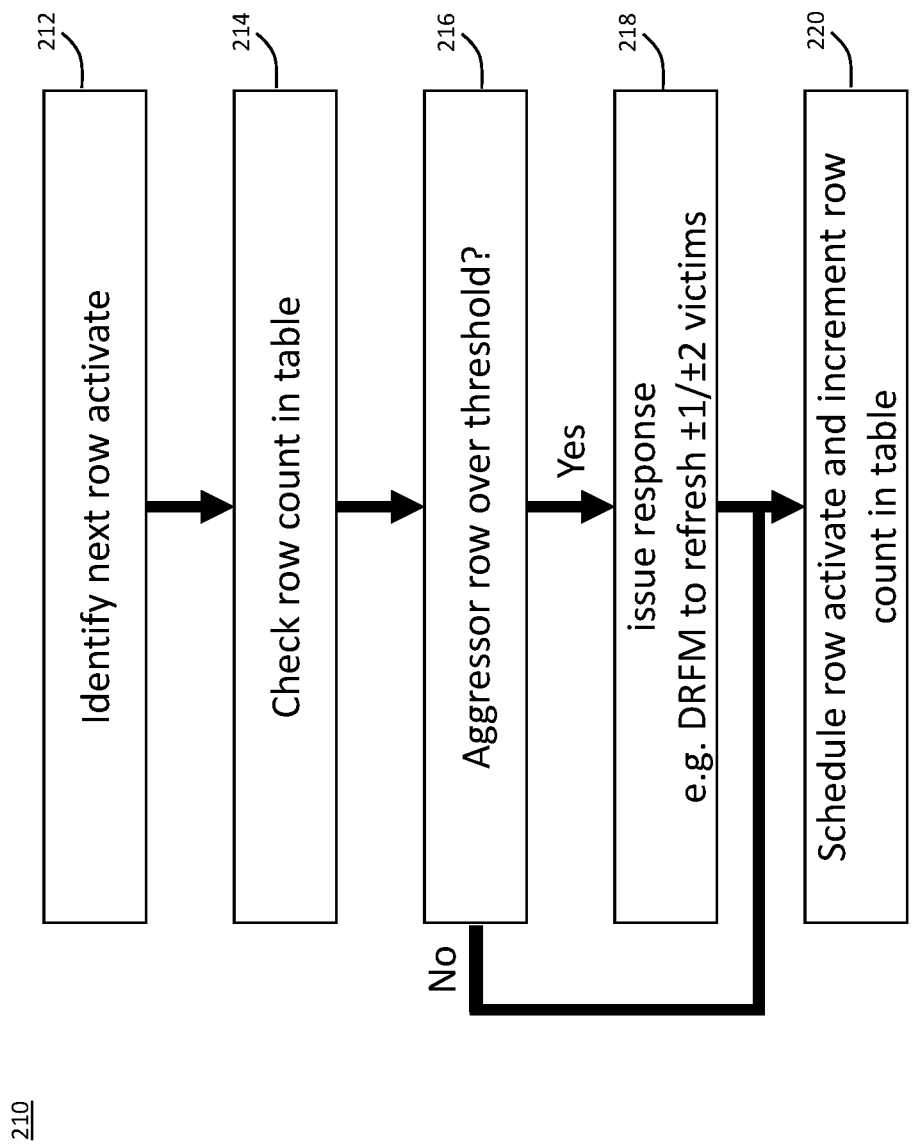
FIG. 2B illustrates a flowchart depicting a basic implementation flow of row hammer mitigation.

FIG. 2B illustrates a flowchart 210 depicting a basic implementation flow of row hammer mitigation. Row hammer mitigation includes two aspects: the first aspect is row hammer detection, and the second aspect is the response to that detection. A variety of responses are possible, with a response commanding the memory device 126 to refresh victim rows (e.g., DRFM response) being one of the possible responses to mitigate or eliminate the effects of row hammer effects. In some instances, the memory controller transmits a refresh command, such as a DRFM response, to the memory device 126 and specifies the aggressor row, and the memory device's internal circuitry determines the victim rows to be refreshed based on the aggressor row identified by the memory controller and refreshes the victim rows.

When a request is received to access a row, which may be referred to as the "aggressor row" (row 207 in FIG. 2A) in this disclosure, in the memory device 126, at operation 212 that row is identified as the next row to activate. At operation 214, a value of a counter configured to keep track of the number of accesses to the aggressor row in a predetermined time period is checked. At operation 216, it is determined whether the value of the counter is above the RHT. When the RHT is exceeded for the aggressor row 207, the integrity of the data in one or more rows (referred to as "victim rows": see rows 208 and 209 in FIG. 2A) physically adjacent to the aggressor row 207 cannot be guaranteed. The RHT may be factory set or may be configured at boot time. If the value is above the RHT, then at operation 218 a response is issued.

One type of response may be a digital refresh management (DRFM) command to refresh the physically adjacent rows (e.g., rows 208 and 209) on either side of the aggressor row 207. When a response is issued at operation 218, the counters of the victim rows (e.g., rows 208 and 209) which are refreshed can be reset (e.g., set to 0). The number of physically adjacent rows to refresh may be preconfigured or may be dynamically determined. After issuing the response at 218, or if at operation 216 it was determined that the aggressor row 207 is not over the RHT, at operation 220, the row activate for the aggressor row is scheduled and the counter for that row is incremented (e.g., incremented by 1).

As noted above, memory device 126 such as, for example, one or more DRAM DIMMs, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in terms of practicality in either energy efficiency and/or space efficiency, the example embodiments of the present disclosure provide a row hammer mitigation technique that provides perfect tracking (i.e. does not allow any false negative row hammer detection) of row hammer attacks in a practical, energy and space efficient manner.

Figure 3:
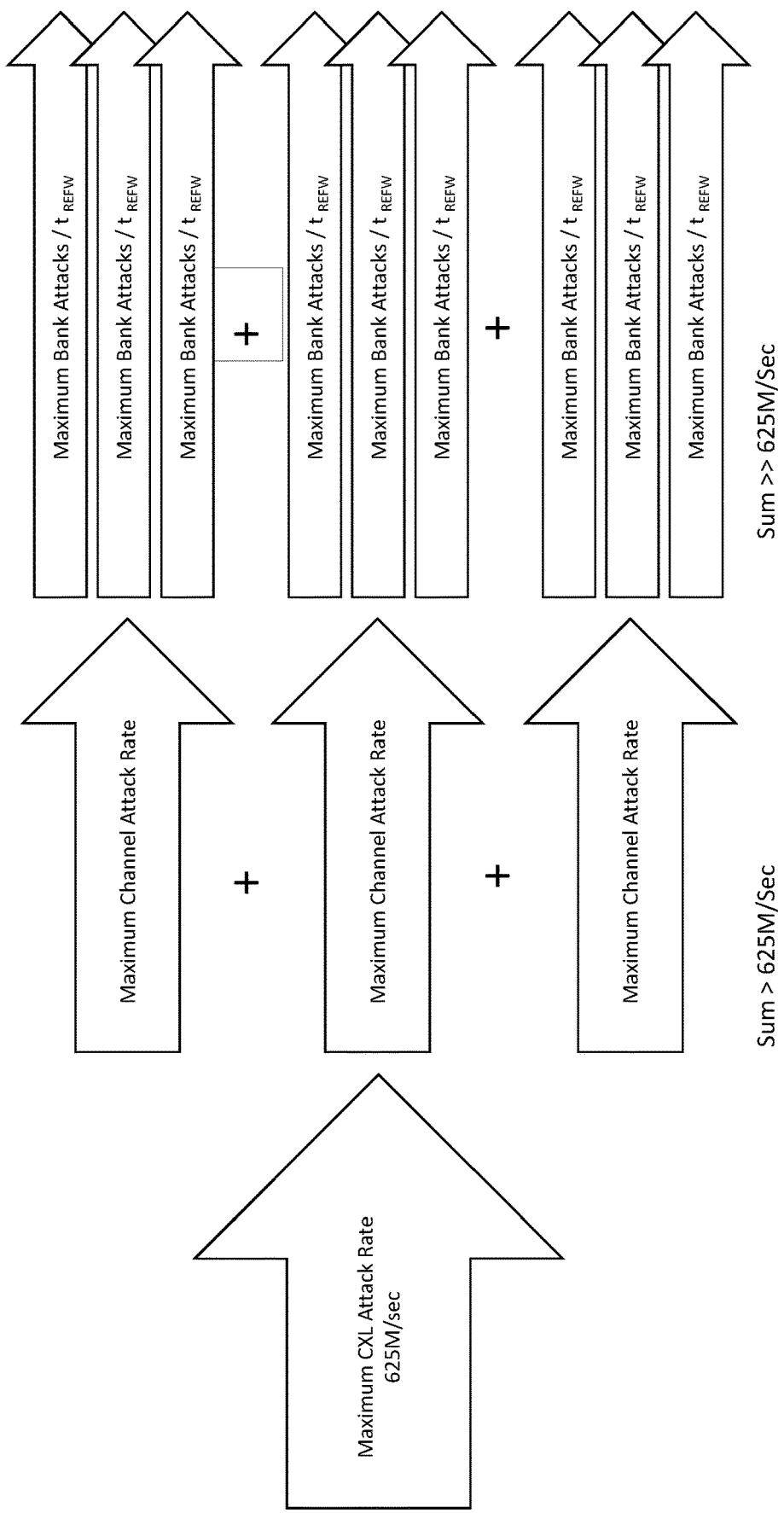
FIG. 3 graphically illustrates an example distribution of row hammer events at the global level in a memory controller, at the channel level and at the bank level.

As shown in FIG. 3, in some example scenarios in which a DRAM memory device is attached to a CXL-compliant memory controller, the global rate of row hammer attacks on the memory device may be about 625 million attacks per second. Thus, if perfect row hammer detection is implemented at the global level for the attached memory device, the row hammer detector must be configured with sufficient counters to detect at least that many attacks occurring in the duration of a second. For example, in the example embodiment shown in FIG. 1, if perfect row tracking were to be implemented globally, the central controller 110 could be configured with a row hammer mitigation circuitry that receives row access information for rows in the attached memory device from the media controllers 120 potentially at the rate of 625 million per second, and communicates mitigation responses (e.g., DRFM) to the respective media controllers 120 as needed.

If per-channel row hammer mitigation is implemented for each media controller 120, then the sum of the attack rates that can be handled by the respective media controllers 120 must at least amount to the 625 million/sec, but such an implementation will be capable of, and accordingly use the space and energy resources required, for tracking a substantially higher rate of row updates because the resources are configured on a per channel basis.

Similarly, if per-bank row hammer mitigation is implemented in each bank controller 128 for each bank in a channel, then the sum of attack rates that can be handled by all the bank controllers must at least amount to the 625 million/sec, but such an implementation will be capable of, and accordingly use the space and energy resources required for, detecting a substantially higher detection rate because the resources are configured on a per-bank basis. Thus, the total amount of space and energy resources that may be required to implement row hammer detection at the bank level exceeds the amount of space and energy resources that may be required at the channel level, which in turn exceeds that of the global level implementation.

Thus, various approaches may be considered to achieve perfect (deterministic) row hammer tracking in the memory controller by accessing multiple rows as one unit (same row on different chips) and thus having only one counter for the group, rather than having a counter for each row of the media device.

A motivation for the approach to a solution described in this disclosure is to, instead of having a counter for each and every row of the memory device, bound the number of counters by the number of potential attacks in a timeframe because only so many attacks can happen, for example, in a 60-millisecond timeframe. In example embodiments, the total number of counters and thus the size of the detector and the amount of resources devoted to the detector, is bound by the total potential number of attacks, not the total amount of memory to protect. Thus, in effect, example embodiments provide a detector algorithm that scales with the maximum potential attacks per unit time as opposed to the maximum memory capacity that is being protected.

A problem with having a separate counter for each row is that, as a big system is created, the memory may grow to many millions, if not a billion, rows. Then having a billion counters, one per row, may yield a billion counters. A billion is a lot more than 625 million per second attacks per second being divided 60 milliseconds, which reduces the number of required counters to the thousands instead of the billions or million that would be required to have a counter for each row of protected memory. Thus, embodiments of the present disclosure provide a row hammer detector that scales with the maximum potential attacks per unit time as opposed to the maximum memory capacity being protected.

As noted above, memory device 126 such as, for example, DRAM, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in either energy efficiency and/or space efficiency, the present disclosure provides a row hammer mitigation technique that provides perfect tracking (i.e., does not allow any false negative row hammer detection) of row hammer attacks in practical, energy and space efficient manner.

Figure 4:
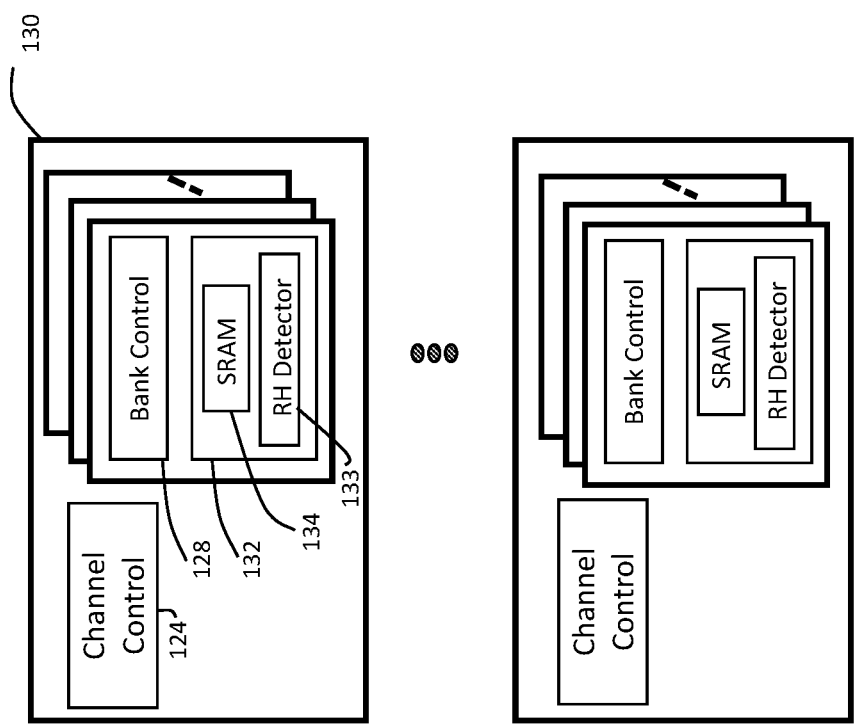
FIG. 4 illustrates a logical block diagram of a per-bank row hammer mitigation component, according to some embodiments.

FIG. 4 illustrates a logical block diagram of a per-bank row hammer mitigation component 132 according to some embodiments. The per-bank row hammer mitigation component 132 is replicated for each bank of the attached memory device 126 that is accessed by the memory controller 100. As shown in FIG. 1, each media controller 120 accessing the media device 126 may have a plurality of per-bank row hammer mitigation components 132, such that each bank controlled by the channel corresponding to that media controller has a corresponding respective per-bank row hammer mitigation component 132.

The per-bank row hammer mitigation component 132 includes a row hammer detector 133 and a SRAM 134. The row hammer detector 133 includes circuitry that monitors the corresponding bank of the memory device 126 for row hammer attacks and when an attack or potential attack is detected, responds appropriately. The SRAM 134 is used by the row hammer detector 133 to maintain counters and other state associated with the row hammer detection of the corresponding bank. Additional required state associated with the row hammer detection may be maintained in d-flip flops associated with the row hammer detector 133.

The "Space Saving" algorithm, which was first described in Metwally et al., "Efficient Computation of Frequent and Top-k Elements in Data Streams," Technical Report 2005-23, University of California, Santa Barbara, September 2005 ("Metwally"), describes a technique to find the most active users of a particular resource or service. One of the use cases described in Metwally is a technique to find a specified number of highest users of a web service. The space saving algorithm can be used to perform deterministic row hammer detection with a lower number of counters than the number of counters that would be required when using a one counter per row in the memory device. Viewed at a high level, the space saving algorithm maintains only the top k (where k may be a predetermined positive number) counters and thus requires much less space for counters. Thus, the space saving algorithm is called space saving because it is only counting the rows that need to be counted as opposed to having a counter for every row. That by definition saves orders of magnitude of space.

The plurality of per-bank row hammer mitigation components 132, in the embodiments primarily described in this disclosure, are included in the memory controller 100. Including the row hammer mitigation circuitry, for example, the plurality of per-bank row hammer mitigation components 132, in the memory controller 100 is advantageous because all accesses to the memory devices 126 protected by the row hammer mitigation circuitry flow through the memory controller 100. However, embodiments of this disclosure are not limited to implementing the plurality of per-bank row hammer components 132 in the memory controller 100. In some embodiments, the plurality of per-bank row hammer components 132 can be implemented externally to the memory controller. Moreover, embodiments may not be limited to storing the counters in SRAM, and in some embodiments the memory 134 may be a memory type different from SRAM but providing for serial search of the counters.

Figure 5:
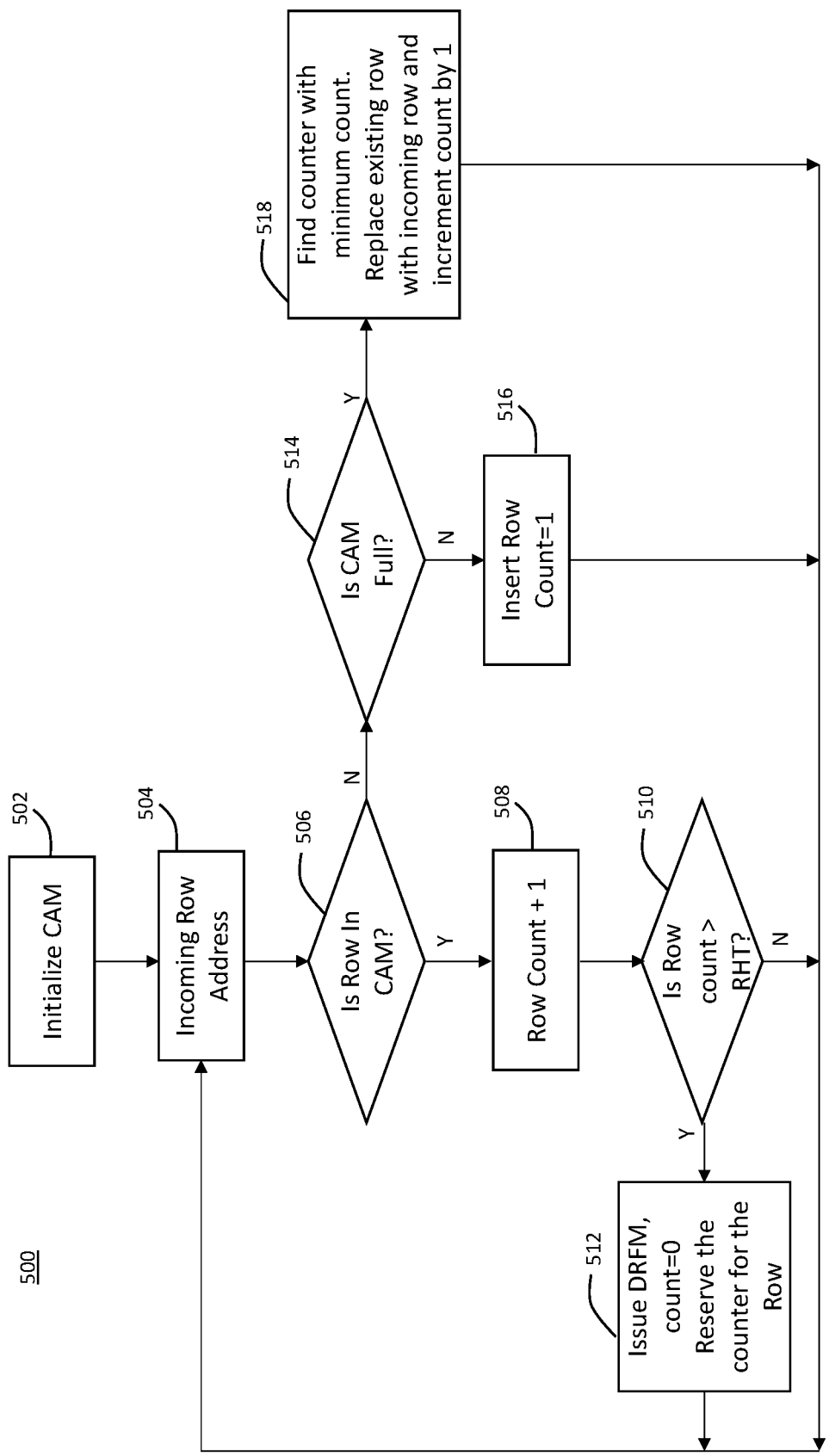
FIG. 5 illustrates a flowchart of a process for row hammer mitigation.

FIG. 5 illustrates a flowchart of a process for row hammer mitigation using aspects of the space saving algorithm described in Metwally. As described U.S. application Ser. No. 17/897,813, filed Aug. 29, 2022, which is already herein incorporated by reference in its entirety, the "Space Saving" algorithm, when modified and enhanced to address row hammer scenarios, also offers complete, accurate and precise detection of any and all row hammer scenarios. However, as described in U.S. application Ser. No. 17/897,813, filed Aug. 29, 2022 the implementation may be prohibitively costly and power intensive requiring both a large content addressable memory (CAM) and magnitude search of the entire detector state.

In the example implementation shown in FIG. 5, a content addressable memory (CAM) is used for maintaining the counters. The RHT may be preconfigured. If n is the maximum row activations during the period, then the CAM total entries is k=n/F, where F is the RHT. The row counter size should at least be log2(RHT). Each row counter may also have a "reserved" bit. The row address size should at least be log2(the number of rows in the media (e.g., DRAM) bank). Thus, the total CAM size may be k*(row counter size+reserved bit+row address size).

At operation 502, the CAM is initialized. The CAM initialization may be performed using a ping-pong reset or similar mechanism at each refresh interval (e.g., (REF, the interval at which rows of the memory device are refreshed). "Ping-pong." as used here, may refer to a tendency for a device, apparatus, or the like, to alternate repeatedly between two or more states. A "ping-pong reset" may provide a mechanism or procedure to disrupt or circumvent such operations, which may allow the device, apparatus, etc. to operate in a different manner. At operation 504, an incoming row address is received. The incoming row address is the address of the row in the memory device 126 that is to be next accessed by the memory controller 100. That is, the row address of the aggressor row 207 is received. At operation 506, the CAM is searched for the aggressor row address. The CAM search is a parallel lookup of all CAM entries.

If the aggressor row address is found at operation 506, then at operation 508, the count associated with that aggressor row address is incremented in the CAM. At operation 510, it is determined whether the incremented count exceeds the RHT. As noted earlier in this disclosure, the RHT specifies a number of accesses for a particular row, which when exceeded, makes the system assume that data integrity of physically adjacent rows, victim rows, is compromised. If it is determined, at operation 510, that the RHT is exceeded for the aggressor row address, then at operation 512, a response is triggered be sent to the memory device. The response can be a signal commanding the memory media device to refresh identified victim rows (e.g., DRFM command), and the counter of the aggressor row is reset (e.g., set to 0).

In some embodiments, in association with the counter being refreshed, additionally a flag associated with the aggressor row counter in the CAM is set to indicate that the aggressor row ID is "reserved." In some embodiments, the flag may be a bit, referred to as a "sticky bit" that, when set (e.g., set to 1), indicates that the aggressor row ID is reserved and thus should not be considered in the selection of the minimum count value in operation 518 described below. Consequently, the sticky bit enables subsequent newly inserted rows to be initialized based on the minimum count value in the CAM while ignoring the recently refreshed rows which may have disproportionately low count values compared to most other rows in the table.

If at operation 506 it is determined that the row address is not in the CAM, then at operation 514, it is determined whether the CAM is full. If the CAM is not full, then at operation 516 the incoming row is inserted, and the count associated with the inserted row is incremented.

If at operation 514 it is determined that the CAM is full, then at operation 518, a row which has the lowest count in the CAM is identified, and that row is replaced in the CAM with the new row. The value of the counter is incremented—effectively introducing the new row to the CAM with a starting value of 1 more than the current minimum count in the CAM. Note that, as described in relation to operation 512, in some implementations in which a row in the CAM has a stick bit set, that row may not be considered when identifying the row which has the lowest count.

FIG. 6 is an illustration of the maintenance of a limited number of counters in accordance with the space saving algorithm. In this example, four counters—counter 1, counter 2, counter 3 and counter 4 are maintained. Each counter (e.g., 606) represents a row at a given instance in time and comprises the address (e.g., row number) of the row and a count (e.g. number of accesses to the row) associated with the row. The counters may be initialized at predetermined intervals. 602 represents a sequence of consecutive row access requests as the requests are received in the illustrated time period (between two refreshes). 604 illustrates the row sought to be accessed (aggressor row) in the corresponding request. Requests 1-3 are accesses to rows 9, 7 and 6, respectively.

Since the four counters are unassigned at the beginning of the illustrated period, the counters 1, 2 and 3 are assigned to rows 9, 7 and 6 in response to the requests 1-3. The respective counters are incremented to 1. Request 4 is an access to row 7 which already has an assigned counter, and thus that counter (counter 2) is incremented from 1 to 2. When request 6 is received for row 11, all four counters are already assigned. That is, there are no unassigned counters. Therefore, a counter with a minimum count value is identified among the assigned counters. In this instance, counters 1, 3 and 4 have the lowest count value of 1, and counter 3 is randomly selected from among the counters with the lowest count values to be reassigned to row 11. Thus, counter 3 is assigned to row 11, but the count value of counter 3 is simply incremented from the current value (i.e., the last value of the counter before the corresponding row is replaced with the selected row)—thus incremented to 2 from 1. By incrementing the count value of the counter even while that counter is reassigned from one row to another, this technique ensures that no row hammer attacks are unaccounted.

Observing requests 10 and 11, it can be seen that counter 4 is reassigned to row 9 at request 10 with an incremented counter value of 2, but then in the very next request is selected again, based on its counter value of 2 being among the lowest counter value at the time, to be reassigned to row 6 with an incremented counter value of 3. Thus, at the end of request 11, row 9 is no longer represented in the counters.

Again, however at request 13 row 9 is accessed. Thus row 9 is reinserted into the counters by being reassigned to counter 3, which at counter value 2 is among the lowest counter values at the time. When row 9 is reintroduced to the counters at counter 3 its incremented counter value is 3. Therefore, the row access tracking process never decreases the value of a counter during a tracking and therefore never misses a potential row hammer attack even while maintaining a small number of counters compared to the total number of rows being protected.

Due to its capability to provide for deterministic row hammer detection with the use of a substantially smaller number (i.e., smaller than the total number of rows of memory media being protected) of counters, the space saving algorithm can be considered for implementation as a row hammer mitigation technique. However difficult problems are encountered in implementing the space saving algorithm in relation to row hammer detection. When implemented as described above in relation to FIG. 5, the use of a large CAM requires prohibitive amounts of area and power. When the CAM is full, the entire CAM must be scanned in parallel to find a minimum count entry to overwrite. Thus, the implementation of space saving algorithm, for example, as described in relation to FIG. 5, is likely to require either more time than practical or simultaneous comparison of many counter values.

The update loop (e.g., operations 504-506-508-510-512) of the space saving algorithm is similar to the basic row hammer update process shown in FIG. 2. However, the space saving algorithm enables deterministic row hammer mitigation with a much smaller number of counters than techniques that require one counter for each row of the memory device. The space saving algorithm counts only the rows that need to be counted in a time interval, as opposed to having a counter for every row. In some implementations, for example, whereas perfect detection according to conventional row hammer detection may have required several million counters so that each row of memory is represented by a respective counter, the modified space saving algorithm used in process 500 may require a number of counters only in the hundreds thus providing a substantial gain in efficiency and reduction of the size of state to be maintained.

A key reason for the energy inefficiency of the implementation shown in FIG. 5, is the test required to determine "is the row in the CAM" at operation 506. A CAM is a highly associative, that is, a parallel comparison, memory. Thus, even though the space saving algorithm might reduce the problem of tracking row hammer attacks from billions of counters down to thousands, the implementation shown in FIG. 5 still requires accessing and doing thousands of comparisons in a short amount of time. For example, in order to handle 625 million/sec events as described above at a global (i.e., all channels) level, about 62000 events may require to be handled every 60 milliseconds. Such use of a large CAM is highly resource intensive both in terms of silicon area and energy and is therefore may not be practical for use in system environments in which row hammer mitigation is required.

The row hammer mitigation in accordance with FIG. 5 may be implemented in each bank. This would result in each per-bank implementation row hammer mitigation having to process an incoming rate of events that is several orders of magnitude less that what needs to be handled at the global level. However, if implemented in accordance with FIG. 5 with the use of a CAM to perform the lookup at operation 506, in each 60 millisecond time period across all banks as many or more than the number required at the global level described above of the highly resource intensive CAM lookups are required. Thus, it is unlikely that per-bank implementation of the row hammer mitigation according to FIG. 5 would be practical.

It is primarily the highly resource-intensive parallel compare that is required to be replicated across every single bank that causes the implementation to be highly inefficient in terms of resource requirements and thus impractical. Each compare requires that the data required for the compare to be read and compared. When done in parallel in the highly associative CAM, even if each data field read is small (e.g., 16, 20 bits), it is still a large amount of bits that are required to be read and compared very frequently to determine a match. The inventors provide a microarchitecture that can take advantage of the lower event rate that is required to be handled at the per-bank level in a more resource efficient manner to make deterministic row hammer mitigation practical in the memory controller.

Despite the above-described potential for higher cost, especially for deterministic row hammer detection which requires a highly associative compare, example embodiments implement row hammer detection at the bank level which necessarily means that the replicating beyond what you might otherwise do if you did it somewhere else. This disclosure describes a practical implementation of a modified "space saving" algorithm that requires neither a CAM nor a complete magnitude search of the detector state. Instead, the disclosed row hammer detector implementation, in some embodiments, uses single-port SRAM(s) and a relatively small quantity of temporary state. As a derivative of the "space saving" algorithm, the disclosed row hammer detection method and apparatus offers provably complete, accurate, and precise row hammer event detection. Its cost and equivalence to perfect tracking enables all row hammer detection to be performed within or in parallel with the memory controller instead of within or partially within the memory media devices. The high precision of the disclosed row hammer detector minimizes the row hammer response rate and consequently minimizes the system performance impact of row hammer scenarios and attacks.

In effect, example embodiments adopt the basic ideas of the space saving algorithm as described in Metwally as modified and used in process 500, breaks down the highly associative comparison and search operation across time such that a smaller amount of search (e.g. fewer read and compare operations are performed) is performed in total for each row access request and that smaller amount of search is performed more slowly on a per-bank basis, when compared to the implementation described in FIG. 5 which uses CAMs that permit very fast parallel search but are costly and consume high amounts of power. Example embodiments take advantage of the fact that the rate of events at a per-bank level at a particular bank is much lower than the global event rate. Example embodiments utilize the time gained (compared to performing operations at the global level) due to processing a smaller number of events per time interval to, instead of doing an associative lookup, perform a serialized search (sequential search) for the aggressor row.

Consequently, instead of looking at all of the thousands of row counters simultaneously, example embodiments look at the first row, then the second row, then at the third, the fourth row, etc. all the way to the last row count in the bank. The lower event rate at the bank level permits the serial search, instead of the parallel search shown in FIG. 5, to be performed at each bank. Moreover, since the search can be terminated when a match if found, on average only half the comparisons that would be typically required in a parallel operation are required to be performed and therefore only half the power requirement. Still further, since the row counters are searched one at a time, the complexity of the circuitry may be substantially less yielding even more of a power saving and an area saving. Consequently, example embodiments provide a much more practical way of performing row hammer mitigation.

Figure 7:
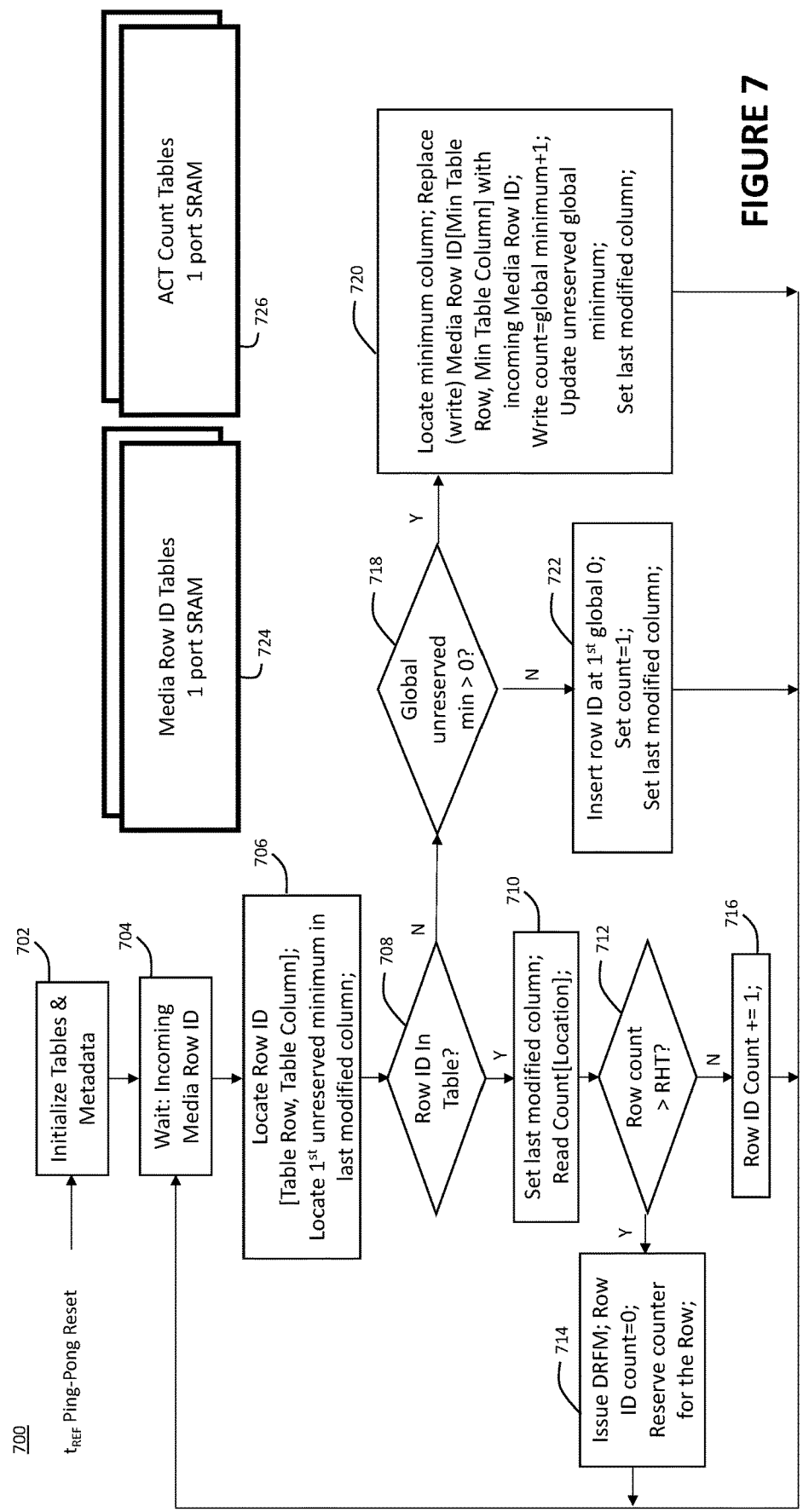
FIG. 7 shows a flowchart of a row hammer mitigation process and associated tables for maintaining some of the state, according to some example embodiments.

FIG. 7 shows a flowchart of a row hammer mitigation process 700 and associated tables 724 and 726, according to some example embodiments. The process 700 may be implemented in the per-bank row hammer mitigation component 132. Thus, in the memory controller 100, the respective per-bank row hammer mitigation component 132 corresponding to each bank of the banks connected to attached media devices 126 will have its own circuitry to independently execute process 700. FIG. 4, for example, shows a respective per-bank row hammer mitigation component 132 for each of a plurality of banks in a channel.

Process 700 may begin at operation 702 during which tables and metadata associated with row hammer mitigation are initialized. The counter tables have an initial state, and moreover, must be cleared periodically. This operation may be triggered/initiated, in some embodiments, in response to a ping-pong reset operation at respective refresh (REF)

intervals of the memory device 126. The reset clears out all of the counters in the modified space saving algorithm mechanism.

At operation 704, an incoming memory media access request (row access request) is received for a particular row of the memory device 126 attached to the memory controller 100. The requested row may be referred to as the aggressor row.

At operation 706, the media row ID table 724 is searched for the row ID of the aggressor row. The media row ID table 724 and ACT count table 726 collectively contain the counter state to keep track of the number of accesses to rows of the media device 126.

Tables 724 and 726 are separate tables that may be formed in separate SRAM devices within, for example, an SRAM 134. In some embodiments, table 724 is formed in a first single-port SRAM device and table 726 is formed in a second single-port SRAM device. The tables 724 and 726 contain row address and counter information for the recently accessed rows. For each counter 1 . . . n maintained by the row hammer mitigation process 700, the row address (row ID) is in Table 724 and the corresponding count is in table 726. Tables 724 and 726 maintain the counters, such as, for example, shown in FIG. 6. The search for the aggressor row ID can be performed serially in table 724. For example, a loop operation may be used for the search in the table 724 SRAM. The comparing of the row IDs and minimum may, in some embodiments, may be performed using D-flip-flop circuitry. In contrast to the more costly CAM and the highly power-inefficient associative search of the CAM required by process 500, the use of the lower cost SRAM for most of the state storage in process 700 enables more power-efficient serial search.

At operation 708, it is determined whether the aggressor row ID is found in table 724.

If the aggressor row ID is found in table 724, then at operation 710 the corresponding count value is determined from table 726. For example, in the search performed in table 724 at operation 706, an index in the table 724 for the location in which the aggressor row ID is found is determined, and the table 726 can be accessed with the same index to determine the count value that corresponds to the counter that contains the aggressor row ID in table 724.

The state maintained for the last modified column is accordingly updated. At operation 712, the count value obtained in operation 710 is compared to the preconfigured row hammer threshold to determine whether count value corresponding to the aggressor row ID exceeds the RHT. Thus, this operation determines whether the aggressor row has been accessed too many times that it would now, or soon (e.g., in 1 or a few more access), potentially corrupt adjacent rows.

If it is determined at operation 712 that the aggressor row has been accessed more than the RHT, then at operation 714 a response, such as a signal commanding the memory device to refresh (e.g., DRFM command) an identified aggressor row's victim rows is transmitted to the memory device. In some embodiments, the memory device includes circuitry to receive an aggressor row ID and, in response, refresh victim rows. In some embodiments, the response may identify the victim rows to be refreshed.

During operation 714, the count value corresponding to the aggressor row ID is set to 0 because the victim rows of the aggressor row have been refreshed in response to the transmitted response.

In some embodiments, in association with the counter value being refreshed, additionally a flag associated with the aggressor row counter in table 726 is set to indicate that the aggressor row ID is "reserved". In some embodiments, the flag may be a bit, referred to as a "sticky bit" that, when set (e.g., set to 1), indicates that the aggressor row ID is reserved and thus should not be considered in the selection of the minimum count value in operation 720 (and/or 706) described below. Consequently, the sticky bit enables subsequent newly inserted rows to be initialized based on the minimum count value in table 726 while ignoring the recently refreshed rows which may have disproportionately low count values compared to most other rows in the table.

If at operation 712 it is determined that the aggressor row has not been accessed more than the RHT, at operation 716 the count value corresponding to the aggressor row ID is incremented.

After either operation 714 or 716, the process 700 proceeds to operation 704 to wait for the next row access request.

If at operation 708 the aggressor row ID is not found in table 724, then the aggressor row ID must be assigned a counter, or, in other words, the aggressor row ID must be inserted into the tables 724-726. Thus, at operation 718, it is determined whether the table 724 is currently full. This is determined by checking whether the global minimum count in table 726 is greater than 0. Note that in embodiments in which a sticky bit is associated with a row in the state tables 724-726, the rows which have its sticky bits set are considered reserved and thus are excluded from consideration from determining the minimum count value in table 726.

During the previously completed operation 706, simultaneously with the search of table 724 for the incoming row ID, optionally table 726 may be searched to find the first unreserved minimum in the last modified column. These two searches can be done simultaneously since the tables 724 and 726 are separate tables each formed in a separate single port SRAM in some embodiments.

If it is determined at operation 718 that the global unreserved minimum is greater than 0 (i.e., that the table 724 is full (i.e., no unreserved/unassigned counters are available)), then at operation 720 the aggressor row ID is entered in table 724 and an associated count update is made in table 726. In an embodiment, a counter with the minimum count value is identified in table 726 and the corresponding counter in table 724 is updated (i.e. existing row ID/address is overwritten with the aggressor row ID/address). The corresponding count value in the table 726 is incremented. For example, the count value can be incremented by setting it to the global minimum value+1.

In this operation, the state maintained for the unreserved global minimum and the last modified column can be set in accordance with the updated counter.

If it is determined at operation 718 that the global unreserved minimum is not greater than 0) (i.e., that the table 724 is not full (i.e., unreserved/unassigned counters are available)), then at operation 722 the aggressor row ID is inserted in table 724 and an associated count update is made in table 726. In an embodiment, the aggressor row ID is inserted at the location of the first global 0 in table 724 and corresponding count value in table 726 is set to 1.

The state maintained for the last modified column is accordingly updated.

After any of the operations 714, 716, 722 and 720, process 700 returns to operation 704 to wait for the next incoming row access.

Figure 10:
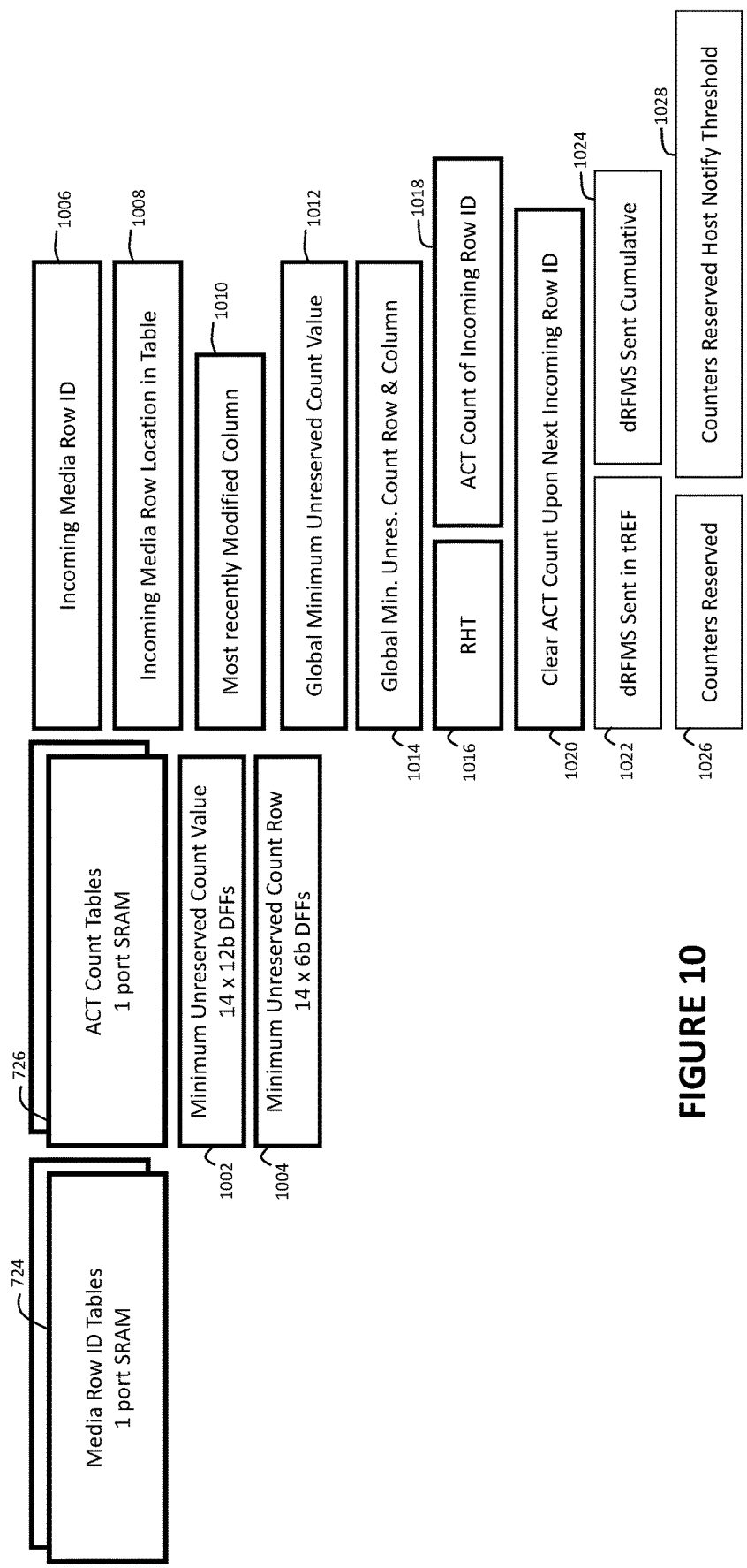
FIG. 10 illustrates examples of state associated with process, according to some embodiments.

In some embodiments, some or all of the operations 702-722 may be performed by detector circuitry 133 of a per bank row hammer mitigation component 132, with most of the required state being maintained in SRAM tables 724-726 and in d-flip-flops as shown in FIG. 10.

Figure 8:
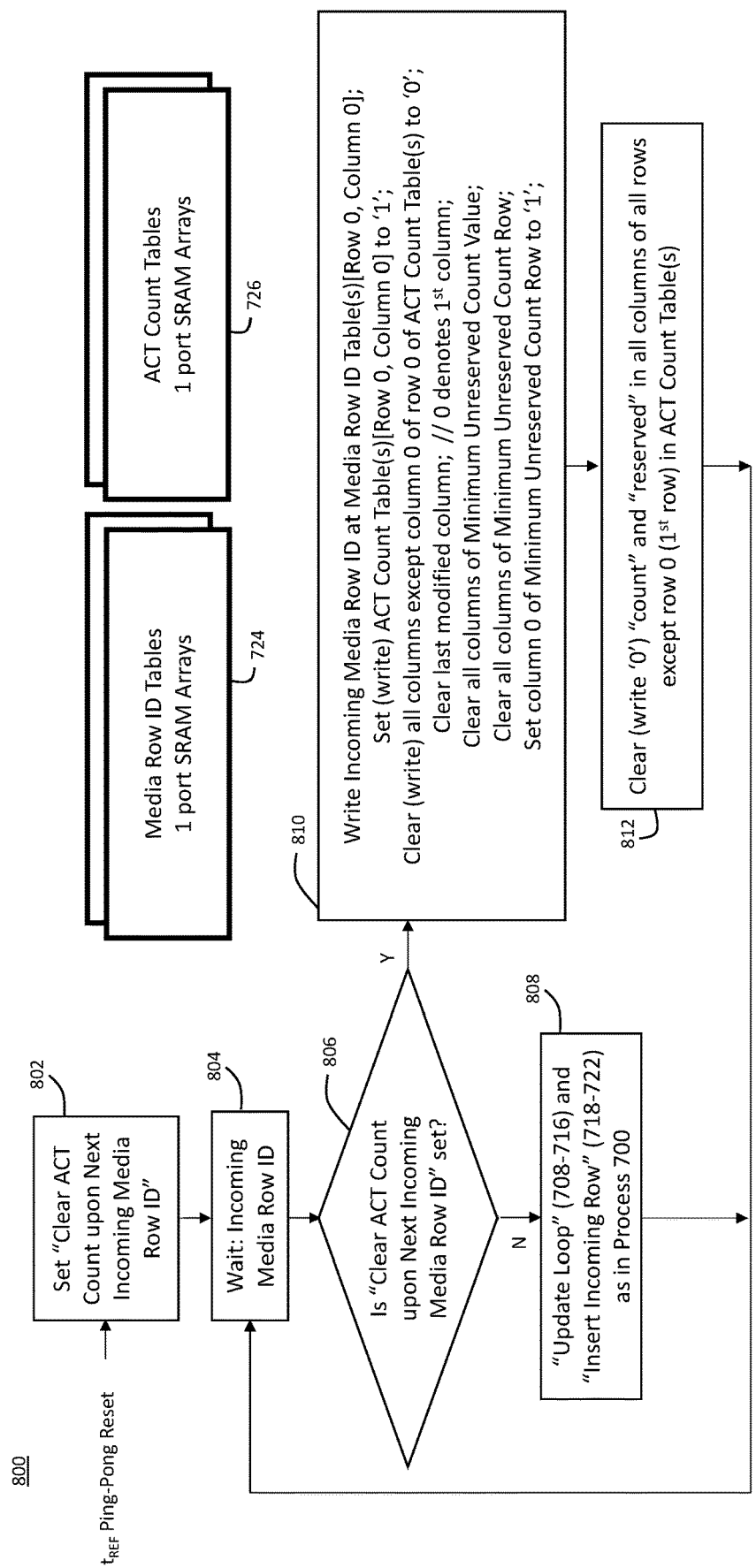
FIG. 8 shows a flowchart of a process which provides an alternative technique to initialize the tables and metadata of the row hammer mitigation technique described in FIG. 7, according to some embodiments.

FIG. 8 show a flowchart of a process 800 which provides a technique to initialize the tables and metadata of the row hammer mitigation technique described with respect to process 700, for example, in operation 702.

At operation 802, in an example embodiment performed instead of operation 702, a flag is set indicating that the ACT counts are to be cleared upon the next incoming media row ID (e.g., row access request for row ID). This operation may be triggered/initiated based on a ping-pong reset at each tREF intervals. In some embodiments, the flag may be set using D-flip-flop circuitry.

At operation 804, as in operation 704 in process 700, an incoming aggressor row ID is received. For example, a row access request for the aggressor row ID is received.

In response to receiving an aggressor row ID, at operation 806 it is determined whether the flag for indicating that the ACT counts are to be cleared upon the next incoming media row ID is set.

If the flag is set, then at operation 810, table 724 is updated by writing the aggressor row ID and setting the corresponding count value in table 726. In an embodiment, the aggressor row ID is written to row 0, column 0 in table 724, the corresponding count at row 0, column 0 in table 726 is set to 1, and clears (writes) all columns expect column 0 of row 0 of the counts in table 726 to 0.

Additionally, in this operation, other actions such as clearing last modified column (//0 denotes 1st column), clearing all columns of minimum unreserved count value, clearing all columns of minimum unreserved count row, and setting column 0 of minimum unreserved count row to '1'.

In some embodiments, whereas some of the table updates (e.g., setting row 0, column 0 and clearing all columns except column 0, as described above) are performed in SRAM, some of the other operations (e.g., clearing last modified column, clearing columns of minimum unreserved count value, clearing all columns of minimum unreserved count row, and setting column 0 of minimum unreserved count row) may be performed in D-flip-flops.

After operation 810, in operation 812, clearing (writing '0') "count" and "reserved" in all columns of all rows except row 0 (1st row) in ACT count table(s) may be performed. This operation may be performed, in some embodiments, by looping in the SRAM.

In operation 806, when it is determined that the flag is not set at operation 808, the update loop (e.g., operations 706, 708, 710, 712 and 724) and/or the insert incoming row (e.g., 706, 708, 718, 720, and 722) described in relation to process 700 is performed.

After either operation 808 or 812, process 800 proceeds to operation 804 to wait for the next incoming row ID.

According to some embodiments, some operations of processes 700 and 800 can be performed in SRAM (e.g., searching counter state tables 724 and 726) and some may be performed in D-flip-flops. This capability to selectively utilize SRAM and D-flip-flops to maintain portions of the required state information allows for an efficient implementation.

The SRAM implementation of the "space saving" algorithm, as implemented in processes 700 and optionally in process 800 are possible because neither the "update loop" (operations 706-716) nor "insert incoming row" (operations 718-722) require simultaneous read and write of the media row ID or ACT count tables.

Figure 9:
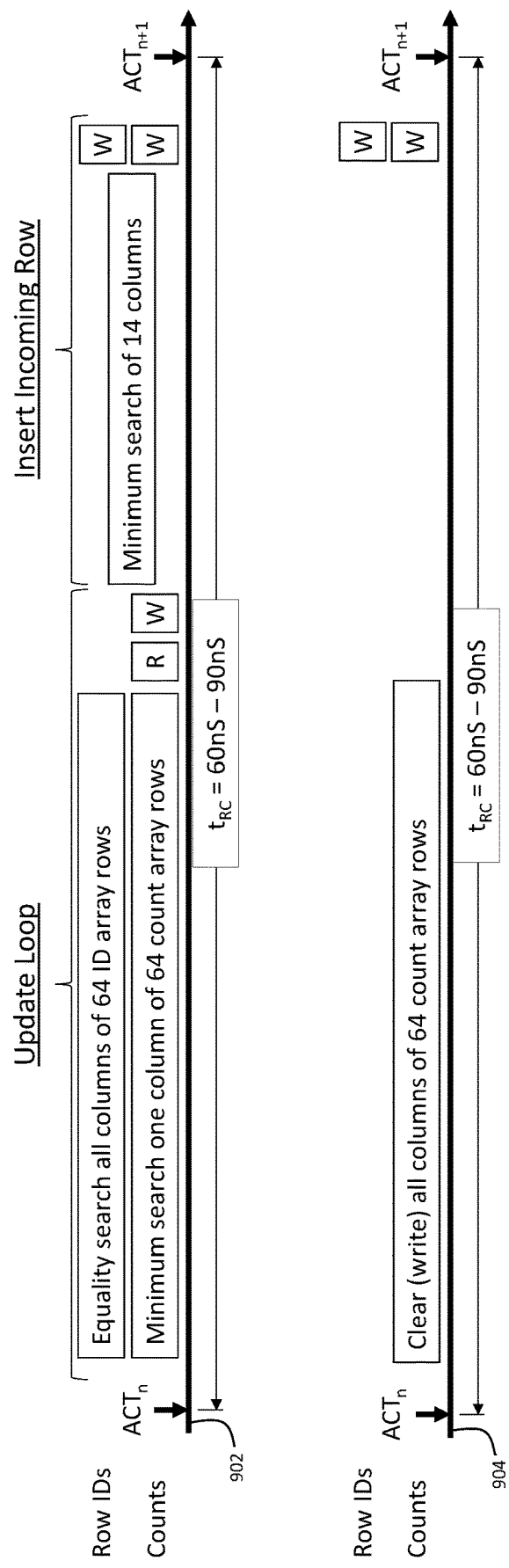
FIG. 9 graphically illustrates some timelines for arranging the operations shown in FIG. 7, according to some embodiments.

FIG. 9 graphically illustrates example timelines per media bank of process 700, according to some embodiments. FIG. 9 illustrates the way process 700 may appear arranged in time when an incoming row access request is received: an equality search for part of the memory array may be performed in table 724, and a minimum search is performed in table 726 for part of the array. As illustrated in timeline 902, a part of the insert new row operations can be performed in parallel with the update loop operations. Specifically, the equality search for a matching row in table 724 performed for the update loop operations and the search for the minimum count in table 726 that is part of the insert new row operations may be performed in parallel with each other.

This parallel search operations reduce the time required for process 700 and is made possible by having the row IDs in a separate table from the count values for the counters. This parallel search capability is an important aspect in making process 700 practical for efficient operation within the time constrains required for row hammer mitigation. These parallel operations may be followed, when the incoming row is not found in the tables and when the tables are full, by the minimum search required for the inserting of the incoming row in the tables 724 and 726. As illustrated, these operations are completed within the interval between two consecutive refresh operations (e.g., row cycle time (tRC) =60 ns–90 ns).

Thus, whereas embodiments require incoming rows to be inserted at the current minimum, embodiments are arranged such that only part of the operations needed to determine the minimum and insert the row needs to be performed sequentially after the equality search. The second portion of the minimum search can be commenced in parallel with or soon after the tail end of the first minimum search such that all but the last modified column is checked in parallel with the equality search.

The tRC is a DRAM timing constraint or metric. And the tRC is the time interval between the activated times of switching between one row and another in the same bank.

Timeline 904 illustrates the clearing of all counts such as in process 700, prior to inserting the initial media row.

FIG. 10 illustrates examples of state associated with process 700, according to some embodiments. In addition to tables 724 and 726, the state maintained in some embodiments may include the minimum unreserved count value 1002, the minimum unreserved count row 1004, the incoming media row ID 1006, the incoming media row location in table 1008, most recently modified column 1010, the global minimum unreserved count value 1012, the global RHT 1016, the ACT count of incoming row ID 1018, the clear ACT count upon next incoming row ID 1020, the number of response signals (e.g., DRFMs) sent in tREF 1022, the number of response signals (e.g., DRFMs) sent cumulative 1024, the counters reserved 1026, and the counters reserved host notify threshold 1028. In some embodiments, the tables 724 and 726, which comprises the substantial majority of state required for processes 700 and 800, are maintained in SRAM which is significantly more area and power and efficient than other state storage such as d-flip-flops which may store state 1002-1026. The state shown in FIG. 10 are examples, and some example embodiments may maintain more or less state than shown. For example, in some embodiments, states 1010-1014, 1022-1028 and/or 1020 may not be maintained.

Any counter-based logic needs reset. Because different memory media rows refresh at different internal media determined times, the ideal time to reset an external counter for a particular media row may be configurable or determined at boot time. Periodic ping-pong reset is a safe counter reset that is possible when paired counters are used in a ping-pong scheme. The time between resets of any particular counter may be configurable, and is e.g., 128 ms (2× tREF) in some embodiments. According to an embodiment, during a first tREF period the ACT counter(s) is in preconditioning state where it is counting but not sending DRFM. During the next tREF period the ACT counter(s) is counting as well as triggering DRFM command(s) or other row hammer response.

A second set of ACT counter(s) operates similarly but is offset by tREF from the first set of ACT counter(s). One set of ACT counters is always active to trigger DRFM commands.

This approach eliminates false negative DRFM triggers. However, this approach requires two sets of counters meaning twice the silicon area and the power. Moreover, there is the potential DRFM is sent based on counts from 2× tREF.

Figure 11:
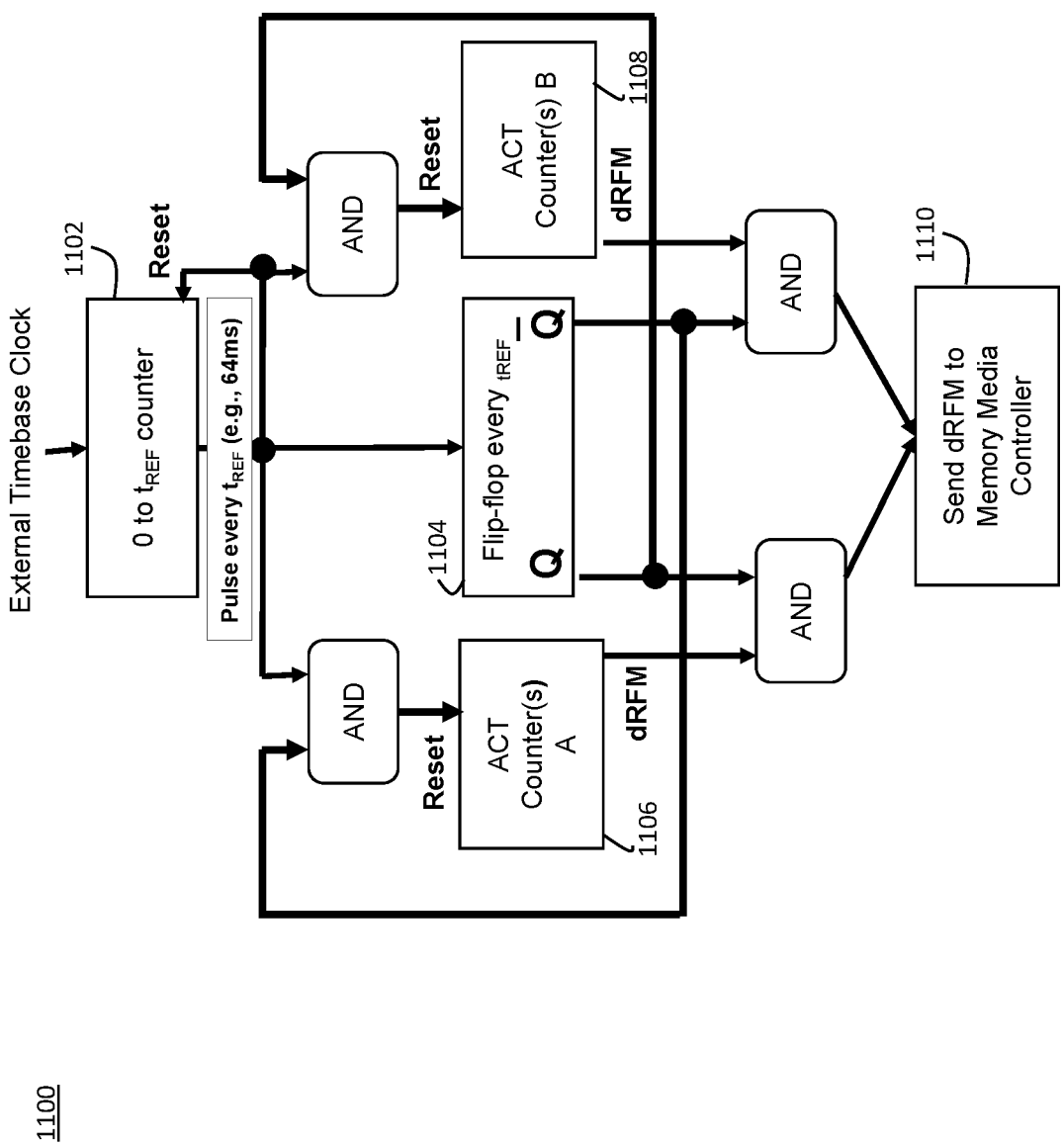
FIG. 11 shows a schematic of a ping-pong reset circuit, according to some embodiments.

FIG. 11 shows a schematic of a ping-pong reset circuit 1100 according to some embodiments. An external clock serves as input to the circuit 1100. Based on the input clock, a 0 to tREF counter 1102 generates a pulse every tREF (e.g., 64 ms). Based on the pulse from counter 1102 a flip-flop 1104 toggles output between 0 and 1 every tREF. ACT Counter(s) A 1106 is reset when ACT Counter(s) B 1108 becomes active (i.e., able to trigger DRFM) and vice versa. Both ACT counter(s) A 1106 and ACT counter(s) B 1108 always receive and count all memory media row activations (ACTs). Both ACT counter(s) A and ACT counter(s) B trigger DRFM (or other row hammer mitigation response) when they reach the memory media RHT count, but based on the state of the flip-flop 1104, only the one of the ACT counters that is "active" can trigger a DRFM, the other ACT counter(s) is ignored. Component 1110 generates the DRFM to the memory media controller to be transmitted to the memory device.

Thus, as described above, in some embodiments, process 700 is separately implemented for each media bank allowing sufficient time for the process's global equality and magnitude comparisons to be performed sequentially on small subsets of its state. The implementation of process 700 at the media bank granularity enables replacement of CAM for the global Row ID equality comparison in the process 500's "update loop" with generic 1-port SRAM.

The magnitude comparison to find the global minimum count value in the "insert incoming row" procedure can be similarly implemented with generic 1-port SRAM by performing a partial minimum value search in parallel with or as part of the sequential implementation of the update loop and only completing a summary magnitude search within the "insert incoming row" procedure.

SRAM implementation of the bulk of the state required by the space saving algorithm makes the space saving algorithm practical for use in row hammer detection. SRAM implementation of the bulk of the state required by the space saving algorithm makes it practical for row hammer detection to be performed within a controller for a large quantity of memory media and that in-turn enables row hammer detection functions to be removed from the controlled memory media, simplifying and reducing the cost and power consumption of that memory media.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "transmit", "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components.

In some examples, the flow of signals between the connected components may be interrupted for a time, for example, using one or more intermediate components such as switches or transistors. The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium.

For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    at least one static random access memory (SRAM) comprising a plurality of counters, each counter comprising a row identifier and a count, and a total number of counters in the plurality of counters being less than a total number of rows monitored by a memory error detector in a memory media device; and
    a circuitry configured to perform operations comprising:
        identifying whether a row identifier of a memory media access request is in the plurality of counters;
        when the row identifier of the memory media access request is identified in the plurality of counters, updating the count of the counter corresponding to the row identifier in the plurality of counters, and if the count exceeds a predetermined threshold, triggering a response to an error in the memory media device; and
        when the row identifier of the memory media access request is not identified in the plurality of counters, updating the counter of the plurality of counters to include the row identifier of the memory media access request.

2. The apparatus according to claim 1, configured to monitor all rows of one bank of a plurality of banks of the memory media device.

3. The apparatus according to claim 1, wherein the SRAM comprises a plurality of single port SRAM.

4. The apparatus according to claim 1, wherein the plurality of counters comprises a first table comprising the row identifiers and a second table comprising the respective count associated with each row identifier in the first table.

5. The apparatus according to claim 4, wherein the identifying whether the row identifier of the memory media access request is in the plurality of counters comprises searching the first table to determine whether a matching entry for the row identifier of the memory access request is present in the first table.

6. The apparatus according to claim 5, wherein the searching is a serial search of the first table.

7. The apparatus according to claim 5, wherein the updating of the counter of the plurality of counters to include the row identifier comprises:
    identifying a minimum count in the second table and inserting the row identifier in the first table in a location that corresponds to the identified minimum count in the second table; and
    incrementing the identified minimum count in the second table.

8. The apparatus according to claim 7, wherein the identifying the minimum value in the second table is at least partially performed in parallel with said searching the first table.

9. The apparatus according to claim 7, wherein the identifying the minimum value in the second table includes considering a sticky bit associated with each count value in the second table.

10. The apparatus according to claim 1, wherein the operations provide deterministic detection of row hammer attacks on the memory media device.

11. The apparatus according to claim 1, wherein the memory media device is dynamic random access memory (DRAM), and wherein the respective bank corresponds to a plurality of rows in the DRAM.

12. The apparatus according to claim 1, wherein the circuit is further configured to clear the plurality of counters in each refresh interval of the memory media device.

13. The apparatus according to claim 1, wherein the response comprises a digital refresh management (DRFM) command to refresh one or more physically adjacent rows of a row corresponding to the row identifier.

14. A method comprising:
    identifying, by a circuit whether a row identifier of a memory media access request is in a plurality of counters stored in at least one static random access memory (SRAM), wherein each counter of the plurality of counters comprises a row identifier and a count, and a total number of counters in the plurality of counters is less than a total number of rows monitored by the circuit in a memory media device;
    when the row identifier of the memory media access request is identified in the plurality of counters, updating the count of the counter corresponding to the row identifier in the plurality of counters, and if the updated count exceeds a predetermined threshold, triggering a response to an error in the memory media device; and
    when the row identifier of the memory media access request is not identified in the plurality of counters, updating the counter of the plurality of counters to include the row identifier of the memory media access request.

15. The method according to claim 14, wherein the plurality of counters comprises a first table comprising the row identifiers and a second table comprising the respective count associated with each row identifier in the first table, and wherein the determining whether the row identifier of the memory media access request is in the plurality of counters comprises searching the first table to determine whether a matching entry for the row identifier of the memory access request is present in the first table.

16. The method according to claim 15, wherein the updating of the counter of the plurality of counters to include the row identifier comprises:
    identifying a minimum count in the second table and inserting the row identifier in the first table in a location that corresponds to the identified minimum count in the second table; and
    incrementing the identified minimum count in the second table.

17. A memory controller comprising:
    a first interface to a host system;
    a second interface coupled to a memory media device, wherein the second interface comprises a plurality of physical interfaces to the memory media device and each of the physical interfaces correspond to a respective channel having a plurality of banks;
    a plurality of devices, each device comprising:
        at least one static random access memory (SRAM) comprising a plurality of counters, each counter comprising a row identifier and a count, and a total number of counters in the plurality of counters being less than a total number of rows monitored by the device in the memory media device; and a circuit configured to perform operations comprising:
identifying whether a row identifier of the memory media access request is in the plurality of counters;

when the row identifier of the memory media access request is identified in the plurality of counters, updating the count of the counter corresponding to the row identifier in the plurality of counters, and if the updated count exceeds a predetermined threshold, triggering a response to an error in the memory media device; and when the row identifier of the memory media access request is not identified in the plurality of counters, updating the counter of the plurality of counters to include the row identifier of the memory media access request.

18. The memory controller according to claim 17, wherein each said device is configured to monitor all rows of a respective bank of the plurality of banks.

19. The memory controller according to claim 17, wherein the plurality of counters comprises a first table comprising the row identifiers and a second table comprising the respective count associated with each row identifier in the first table.

20. The memory error detector according to claim 1, wherein the operations provide deterministic detection of row hammer attacks on the memory media device.

* * * * *